US012604431B1

(12) United States Patent
Manes et al.

(10) Patent No.: US 12,604,431 B1
(45) Date of Patent: Apr. 14, 2026

(54) INTERNAL CABLE MANAGEMENT SOLUTION

(71) Applicant: Seagate Technology LLC, Fremont, CA (US)

(72) Inventors: Joseph P. Manes, Arvada, CO (US); Chad Aaron Bogacz, Longmont, CA (US)

(73) Assignee: Seagate Technology LLC, Fremont, CA (US)

( * ) Notice: Subject to any disclaimer, the term of this patent is extended or adjusted under 35 U.S.C. 154(b) by 249 days.

(21) Appl. No.: 18/441,186

(22) Filed: Feb. 14, 2024

(51) Int. Cl.
*H05K 7/14* (2006.01)
*H05K 7/20* (2006.01)

(52) U.S. Cl.
CPC ....... *H05K 7/1491* (2013.01); *H05K 7/20736* (2013.01)

(58) Field of Classification Search
CPC .................................................... H05K 7/1491
See application file for complete search history.

(56) References Cited

U.S. PATENT DOCUMENTS

| | | | |
|---|---|---|---|
| 7,472,795 B2 * | 1/2009 | Dubon | .................... H02G 3/128 |
| | | | 211/26 |
| 8,387,933 B2 * | 3/2013 | Yu | ......................... H05K 7/1491 |
| | | | 248/220.22 |
| 9,326,415 B2 | 4/2016 | Rauline | |
| 9,699,936 B1 | 7/2017 | Vargas | |
| 9,781,859 B1 * | 10/2017 | Wishman | ............. H05K 7/1492 |
| 9,913,397 B2 | 3/2018 | Miwa | |
| 10,998,703 B1 | 5/2021 | Paske | |
| 2004/0035983 A1 | 2/2004 | Simonson | |
| 2017/0332509 A1 * | 11/2017 | Miyatsu | .................. G06F 1/186 |
| 2020/0064576 A1 | 2/2020 | Pilon | |

* cited by examiner

*Primary Examiner* — Mukundbhai G Patel
(74) *Attorney, Agent, or Firm* — Mueting Raasch Group

(57) ABSTRACT

An electronics enclosure includes a fixed part that attaches to a rack and a sliding part that houses equipment. The sliding part is slidably disposed in the fixed part. The fixed part has a floor that is adjacent to a bottom of the sliding part. A cable harness has a first end attached to a back end of the sliding part and a second end attached to a back end of the fixed part. The cable harness includes a cable extending from the first to second ends of the cable harness. The cable harness includes at least one puck that is fastened to the cable and allows the cable to bend at the puck between the first and second ends along a bendable axis. The puck is slidable along the floor of the fixed part when the sliding part is transitioned between a closed state and an opened state.

20 Claims, 6 Drawing Sheets

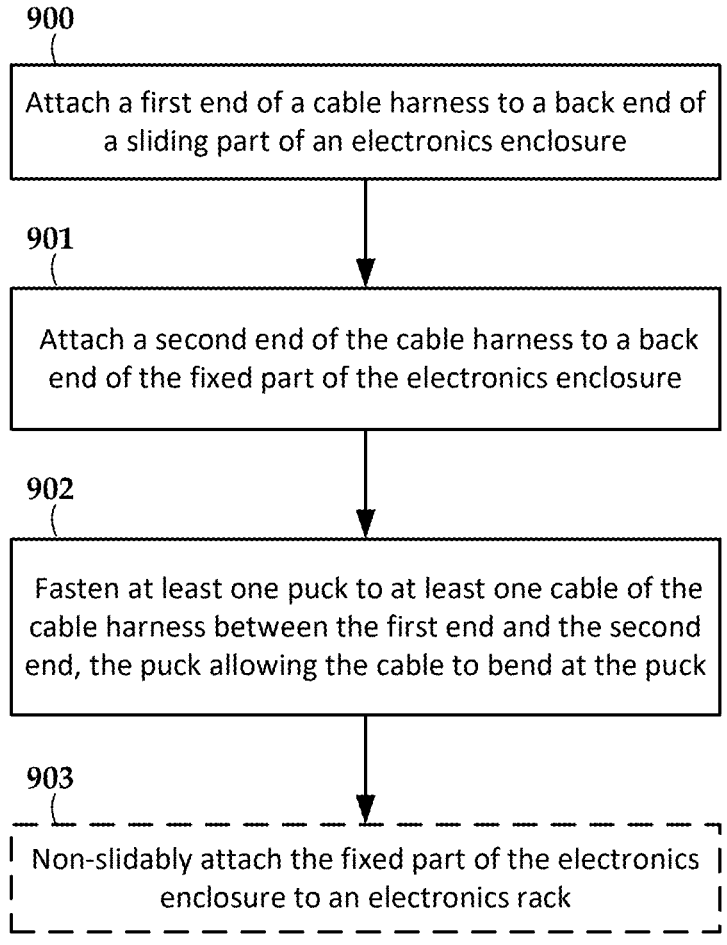

900

Attach a first end of a cable harness to a back end of a sliding part of an electronics enclosure

901

Attach a second end of the cable harness to a back end of the fixed part of the electronics enclosure

902

Fasten at least one puck to at least one cable of the cable harness between the first end and the second end, the puck allowing the cable to bend at the puck

903

Non-slidably attach the fixed part of the electronics enclosure to an electronics rack

*FIG. 9*

INTERNAL CABLE MANAGEMENT SOLUTION

SUMMARY

The present disclosure is directed to a server rack cable management arrangement. In one embodiment, an electronics enclosure includes a fixed part that attaches to a rack and a sliding part that houses computing equipment. The sliding part is slidably disposed in the fixed part. The fixed part has a floor that is adjacent to a bottom of the sliding part in a closed state of the electronics enclosure. A cable harness has a first end attached to a back end of the sliding part and a second end attached to a back end of the fixed part. The cable harness includes at least one cable extending from the first end to the second end of the cable harness. The at least one cable has a bendable axis and a rigid axis orthogonal to the bendable axis. The cable harness includes at least one puck that is fastened to the at least one cable and allows the at least one cable to bend at the puck between the first and second ends along the bendable axis. The puck is slidable along the floor of the fixed part when the sliding part is transitioned between the closed state and an opened state.

In another embodiment, a method involves attaching a first end of a cable harness to a back end of a sliding part of an electronics enclosure that is slidably mounted to a fixed part of the electronics enclosure. The fixed part has a floor that is adjacent to a bottom of the sliding part in a closed state of the electronics enclosure. The method involves attaching a second end of the cable harness to a back end of the fixed part of the electronics enclosure, and fastening at least one puck to at least one cable of the cable harness between the first end and the second end. The at least one cable has a bendable axis and a rigid axis orthogonal to the bendable axis. The puck allows the at least one cable to bend at the puck along the bendable axis. The puck is slidable along the floor of the fixed part when the sliding part is transitioned between the closed state and an opened state.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIG. 9 is a flowchart of a method according to an example embodiment.

DETAILED DESCRIPTION

This disclosure generally relates to rack mounted computer systems. With the ever-increasing demand for Internet data services, the global data center market is projected to grow at a compound annual growth rate of over 10% from 2023 to 2030. This growth in demand will drive the building of new data centers and retrofitting of existing data centers.

Data centers typically house computer hardware in equipment racks. Inside each rack are one or more enclosures that often house tightly packed computer components such as computer boards (e.g., blade servers), graphics processing units, tensor processing units, storage units, and the like. Typically, the enclosures are mounted via drawer slides, which facilitate easy access to the components inside the enclosure.

In many cases, the enclosures are provided by a vendor according to specification and added to the racks of the data center by a systems integrator. Because rack sizes are standardized, it is relatively easy to ensure that a given enclosure will fit in a given rack. The systems integrator will typically design and build infrastructure for the installation and operation of the equipment, such as cooling, power cabling, and data cabling. This presents challenges because the equipment can use significant electrical power and generate a large amount of that needs to be removed. The routing of large number of cables utilized to connect all of the devices together can also take a significant amount of effort.

Figure 1:
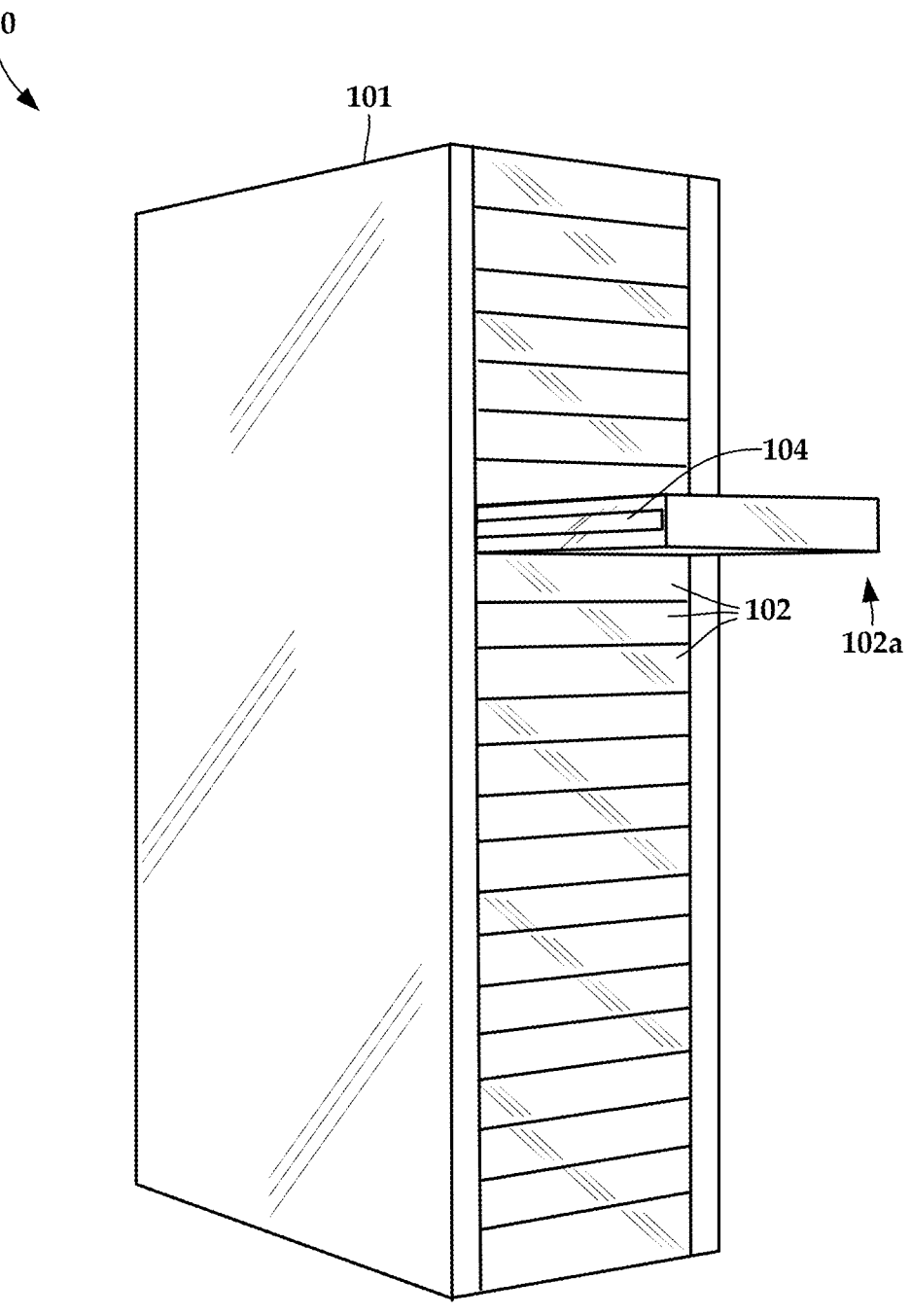
FIG. 1 is a perspective view showing an equipment rack according to an example embodiment.

In this disclosure, apparatuses and methods are described that make cable management easier in an environment such as a data center where rack mounted machines are integrated into a large-scale computing system. In FIG. 1, a perspective view shows a rack 100 assembly of the type that is often used in a data center, and which houses equipment according to one or more embodiments. The rack assembly 100 includes a rack frame 101 that mechanically houses a plurality of equipment enclosures 102, also referred to as units or chassis. The rack frame 101 (also referred to just as the rack) includes structural supports (e.g., vertical and horizontal beams), covers, mounting points, floor supports, and the like.

The physical dimensions of the rack frame 101 and its constituent components are often referred to in terms of rack units 'U' or 'RU', which is defined as 1.75 inches of height. So a 4U enclosure has a 7 inch vertical dimension of at least the front panel, and a 44U rack can hold eleven 4U enclosures. Racks are readily available in different widths and depths. For example, 19 inch width and 24 inch depth enclosures are commonly available in a variety of heights. Depth sizes can vary depending on application. The present cable management systems are not limited to any particular rack or enclosure size, although may provide additional benefits for larger enclosure sizes, e.g., 2U and above.

As indicated by slide 104 on extended equipment enclosure 102a, the enclosures 102 are commonly mounted on drawer slides. This facilitates maintenance of the equipment housed in the enclosures 102, which often includes hot swapping components. Hot swapping generally refers to replacing a part without powering down or otherwise stopping a containing unit. In the case of a disk array, for example, individual drives can be removed and replaced from/to the backplane without affecting (e.g., halting) the backplane, other drives on the backplane, or computers that are using the disk array.

In order to facilitate moving the enclosures 102 in and out of the rack frame 101, the systems integrator will often include a cable management system to allow the cables to extend and retract in an orderly fashion when the enclosures 102 are opened (slid outside of the rack) and closed (slid into place inside the rack). These cable management solutions commonly employ articulated arms that are attached to a back support of the rack, and the cables are attached to the arms in a way that they can flex in a desired way (e.g., to fold into a zig-zag or serpentine shape in the retracted configuration). The cables may be loosely attached to the arms various locations, e.g., resting on hooks, channels or other supports and/or secured using zip ties onto elongated parts of the arms. The arms may be spring loaded to assist in folding the cables back into the retracted configuration.

These existing cable management solutions are well-established, but may have some disadvantages in some situations. For example, it is time-consuming for the systems integrator to route and attach the wires onto the articulated arms. The arms and attachment mechanisms can take up significant space, possibly requiring a deeper enclosure than might be needed if the arms weren't used. In some cases, the space taken up by the arms and associated mechanisms can block airflow in the back of the server enclosure, which can be a concern for heat management in the enclosure. Also, the arms and attachments can sometimes restrict the ability of the cables within the bundles to move freely with respect to each other. At the controlled bends, each individual cable forms a different radius. As the bundle is cycled, each cable length between bends conflicts and forces the bundle to "fan" apart. The arms and attachments can restrict this natural result forcing, the individual cables to slide against each other and buckle within the contained hardware.

In embodiments described below, a solution is described in which self-contained units include an extendable and retractable cable harness inside a fixed enclosure. The fixed enclosure includes a drawer-like electronics enclosure within that can slide in and out of the fixed enclosure. The cable harnesses are self-supporting, e.g., require no arms or other mechanisms to hold them in place. The systems integrator can hard mount the electronics enclosure to the rack and connect fixed-length cables to the back of the electronics enclosure. In some cases, the rear connectors can be sliding connectors, such that the maintainer need not access the back of rack to connect and disconnect the cables. By having all of the cable management for extension and retraction located inside the enclosure, the units are significantly easier to deploy within the rack. This solution may provide other benefits, such as allowing for increased and/or more predictable airflow through the unit.

Figure 2:
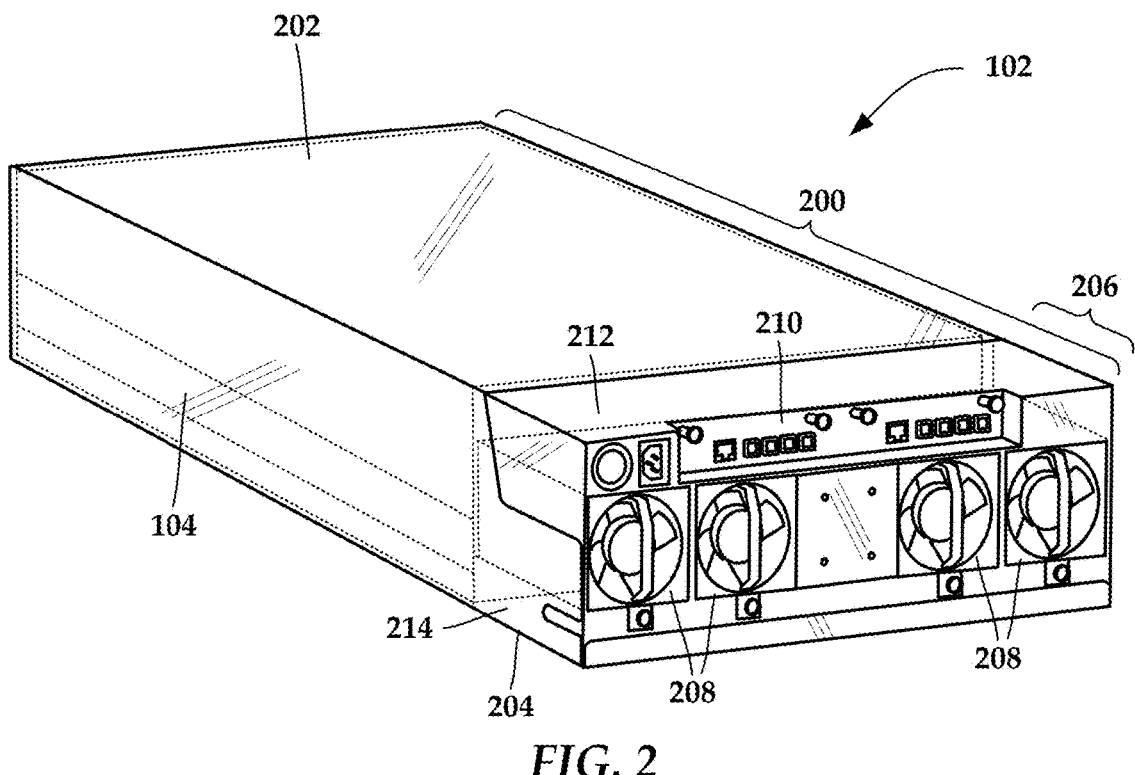
FIGS. 2, 3, and 4 are perspective views of an electronics enclosure according to an example embodiment.

In FIG. 2, a perspective view shows an electronics enclosure 102 according to an example embodiment. The electronics enclosure 102 has a fixed part 200 that is hard mounted to a rack (e.g., rack frame 101 in FIG. 1), e.g., without slides between the fixed part 200 and the rack, although slides may be used as well. The electronics enclosure 102 has a sliding part 202 (indicated using dotted lines) that is slidably mounted within the fixed part 200, e.g., via drawer slides 104 that are also shown in FIG. 1. The fixed part 200 has a floor 204 that is adjacent to a bottom of sliding part 202 in a closed state of the electronics enclosure 102, the closed state being shown in FIG. 2.

The fixed part 200 includes a rear section 206 which faces the back of the rack when the electronics enclosure 102 is installed. The rear section 206 includes fan modules 208, a data connector panel 210, and a power interface 212. The data connector panel 210 and power interface 212 are coupled to respective data and power cables (not shown) that may be attached to the power interface 212 via a back side of the rack.

At a bottom of the rear section 206 is a cavity 214 in which a cable harness 300 (see FIG. 3) is folded when the electronics enclosure 102 is in the closed state. This prevents the cable harness 300 from blocking airflow generated by the fan modules 208. The folding of the cable in the cavity 214 also helps minimize a depth of a rack in which the electronics enclosure 102 is mounted.

Figure 3:
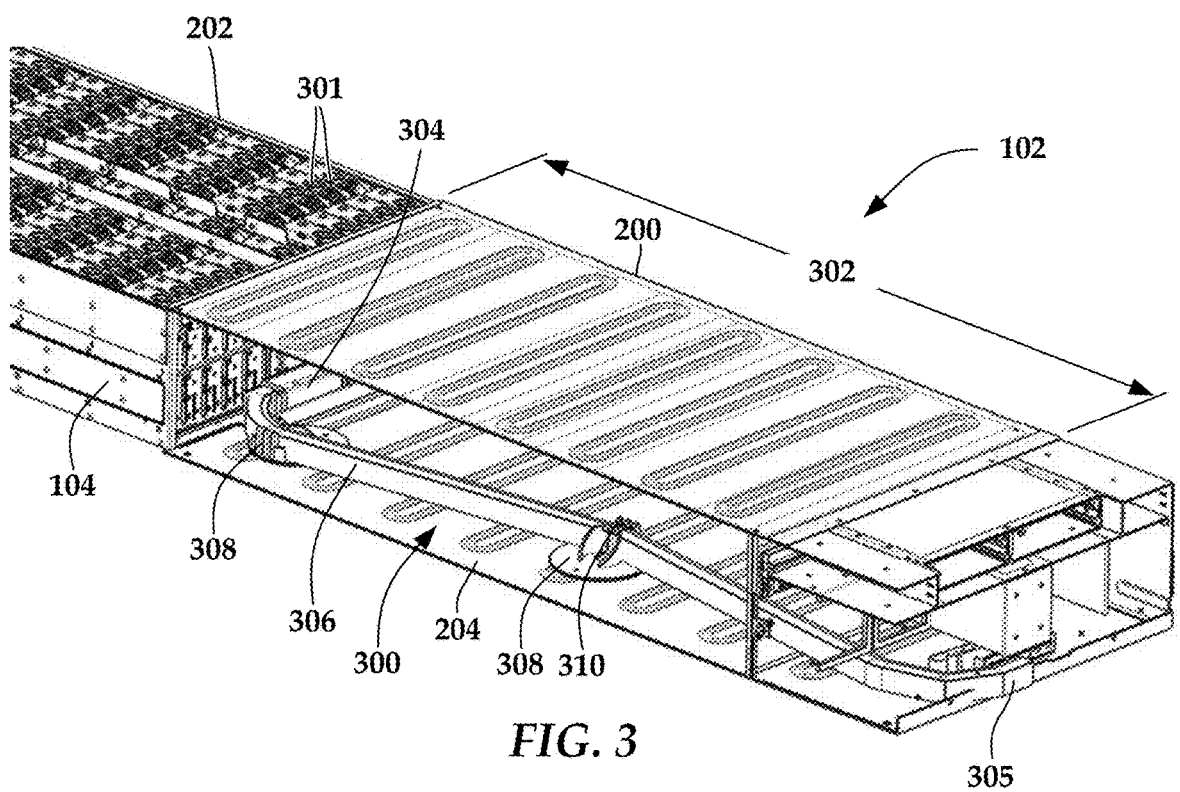

In FIG. 3, a perspective view shows details of the electronics enclosure 102 in an open state according to one or more embodiments. Note that one side of the fixed part 200 is removed in this view to enable viewing components inside. The sliding part 202 is extended from the fixed part 200 where it would extend from the front of a rack by a distance 302. The extension distance 302 is around a meter in some embodiments. The cable harness 300 can be seen in this view, and is in an unfolded state corresponding to an open state of the electronics enclosure 102. Also seen in this view is computing equipment 301 housed in the sliding part 202. The computing equipment 301 includes an array of storage drives (e.g., disk drives, solid-state drives), although any type of electronics equipment could be housed in the sliding part 202.

The cable harness 300 has a first end 304 attached to a back end of the sliding part 202 and a second end 305 attached to a back end of the fixed part 200. The cable harness 300 includes at least one cable 306 configured as a ribbon cable having a bendable axis 508 and a stiff axis 506 orthogonal to the bendable axis 508 (see FIG. 5). The cable harness 300 includes at least one puck 308 (two in this example) that is fastened to the cable 306 via straps 310 and allows the cable harness to bend at the puck 308 between the first and second ends 304, 305 along the bendable axis. The puck 308 is slidable along the floor 204 of the fixed part 200 when the sliding part 202 is transitioned between the closed state and an opened state.

Figure 4:
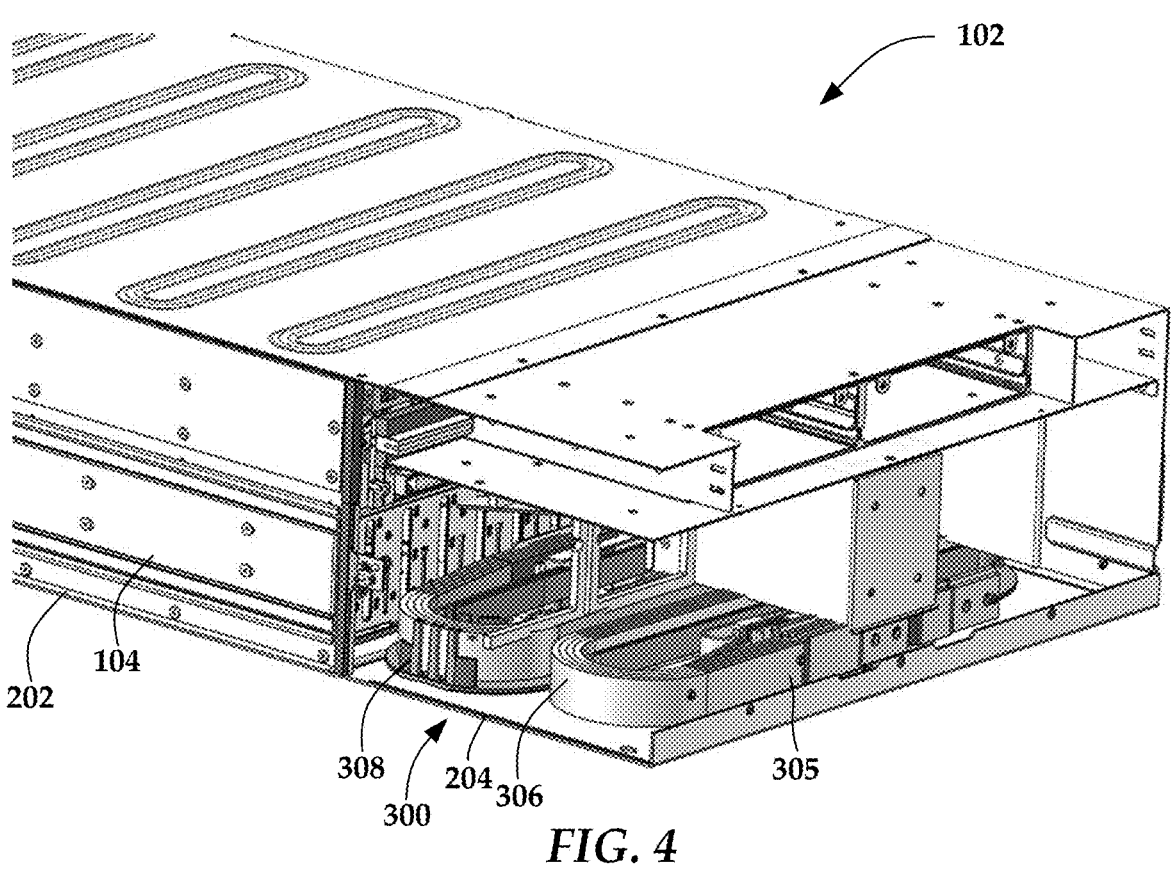

In FIG. 4, a perspective view shows details of the electronics enclosure 102 in a closed state. The cable harness 300 is fully folded and the pucks 308 are pushed towards the sides of the fixed part 200. The pucks 308 are enforcing a minimum bend radius on the cables 306 in this state. In order to accomplish this, the pucks 308 may have a curved surface on which an inner bend of the cables 306 rest when folded, and this inner bend has a radius greater than or equal to the largest minimum bend radius within the bundle of cables 306.

Figure 5:
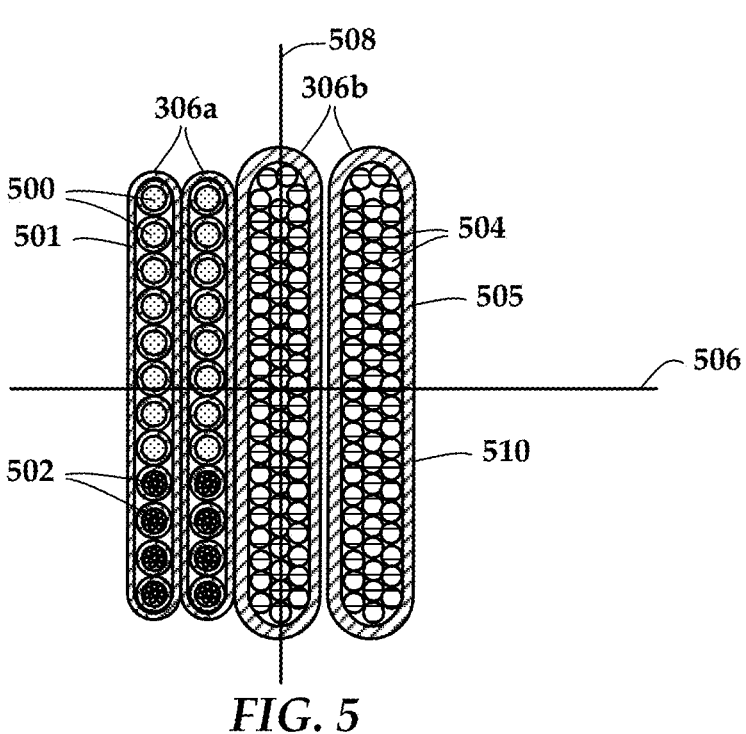
FIG. 5 is a cross-sectional view of cables used in an enclosure according to an example embodiment.

In FIG. 5, a cross-sectional view (not necessarily to scale) shows details of the at least one cable 306 of the cable harness 300 according to one or more embodiments. This example shows two data cables 306a and two power cables 306b, both configured as ribbon cables. The data cables 306a are shown with a combination of single carrier medium 500 (e.g., optical fibers or single wires) and stranded media 502 (e.g., twisted pair copper wires or optical fiber bundles), although just one or the other of the media 500, 502 may be used in a given ribbon cable.

The individual signal media 500, 502 are shown with their own insulation/jacketing, however an outer jacket 501 that covers each cable 306a may also fully surround each of the media 502, 504 such that individual insulation is not required. The power cables 306b include uninsulated conductors 504, e.g., a flat braid of copper wires. An outer jacket 505 provides insulation for the conductors 504. This type of cable 306b may be commercially available, for example, as an insulated, flat grounding strap, and may also be referred to herein as a ribbon cable due to its form factor.

Each of the cables 306a-b has a bendable axis 508 and a rigid axis 506 orthogonal to the bendable axis 508. The terms "rigid" and "bendable" are meant to imply that the cables will bend much less along the rigid axis 506 than the bendable axis 508 in response to the same moment being applied across the respective axes. The relative flexibility of the cables about these axes 506, 508 is due to the form factor.

The cables 308*a-b* may have different thicknesses as well as different bending stiffness around their respective bendable axes 508, and so cables 306*a-b* may be bundled into the cable harness 300 such that they can slip relative to one another during bending and unbending, e.g., are not tightly bound together by fastening straps 310. The cables 306*a-b* will also have a twisting axis (not shown), which corresponds to an axis normal to the plane of the page. The cables 306*a-b* may have little or no moment applied along the twisting axis in normal operation.

Figures 6, 7:
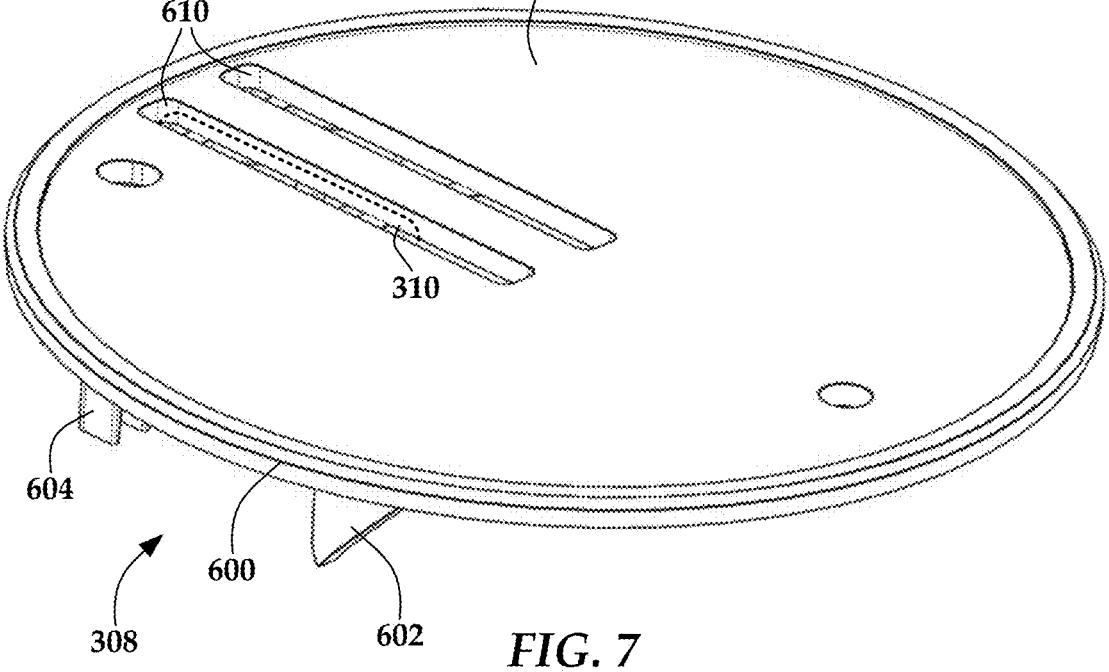
FIGS. 6 and 7 are perspective views of a puck according to an example embodiment.

In FIGS. 6 and 7, a perspective views shows details of a puck 308 according to one or more embodiments. As best seen in FIG. 6, the puck 308 includes a base 600, e.g. a circular flat plate. An inner support 602 and an outer support 604 extend from the base 600. The cables are placed between the inner and outer supports 602, 604. The inner support 602 has a convex curved surface 603 that contacts a major surface of the at least one cable 306 (see major surface 510 in FIG. 5) to enforce a minimum bend radius on cable harness as described above. The outer support 604 protects the cable from contacting the inner walls of the enclosure (e.g., fixed part 200) thereby protecting the cables from sliding wear, punctures, and the like.

The inner and outer supports 602, 604 have respective slots 606, 608 that facilitate attaching fastening straps 310 (e.g., zip ties, Velcro straps; drawn in dotted lines) around the cables to prevent the bend location from migrating while extending and folding. In some embodiments, only a single slot is used on each of the inner and outer supports 602, 604, with a corresponding single fastening strap. The base includes elongated slots 610 that are aligned with the support slots 606, 608. As seen in FIG. 7, the elongated slots 610 house the fastening straps 310 such that the fastening straps 310 can be secured around the inner and outer supports 602, 604 without extending beyond a bottom surface 700 of the base 600. In other embodiments, two holes could be provided in the base such that the fastening strap 310 contacts the floor. In such a configuration, the fastening strap 310 can serve as a slide bearing for the base 600.

The pucks 308 can be made from commercially available plastics such as acrylonitrile butadiene styrene (ABS), polylactic acid (PLA), acrylic, nylon, etc. The shape is amenable to a number of different manufacturing processes such as injection molding, casting, and 3D printing. In other embodiments, the pucks 308 can be made of metal, e.g., aluminum, magnesium, etc. Generally, material choice should consider the ability of the puck 308 to slide along the metal floor 204 with low friction. In embodiments where fastening straps 310 are used, the material and feature sizes should be selected to withstand forces applied by the fastening straps 310 without buckling or otherwise significantly deforming the supports 602, 604.

Many variations are possible for the puck 308 shown in FIGS. 6 and 7. For example the bottom surface 700 may be a convex curved surface to reduce friction against the floor of the fixed part of the enclosure. The base 600 is shown with a circular outer shape, however other shapes may be used. Instead of using a fastening strap, the puck 308 may include an integrated fastening member, e.g., a hinged member that is closed across the inner and outer supports 602, 604 and is held in place by a locking member, e.g., a snap mechanism. In other embodiments, the puck 308 may utilize a different type of non-integrated fastening member besides strap, e.g., a U-shaped lid that fits across the inner and outer supports 602, 604 and snaps into place.

Figure 8:
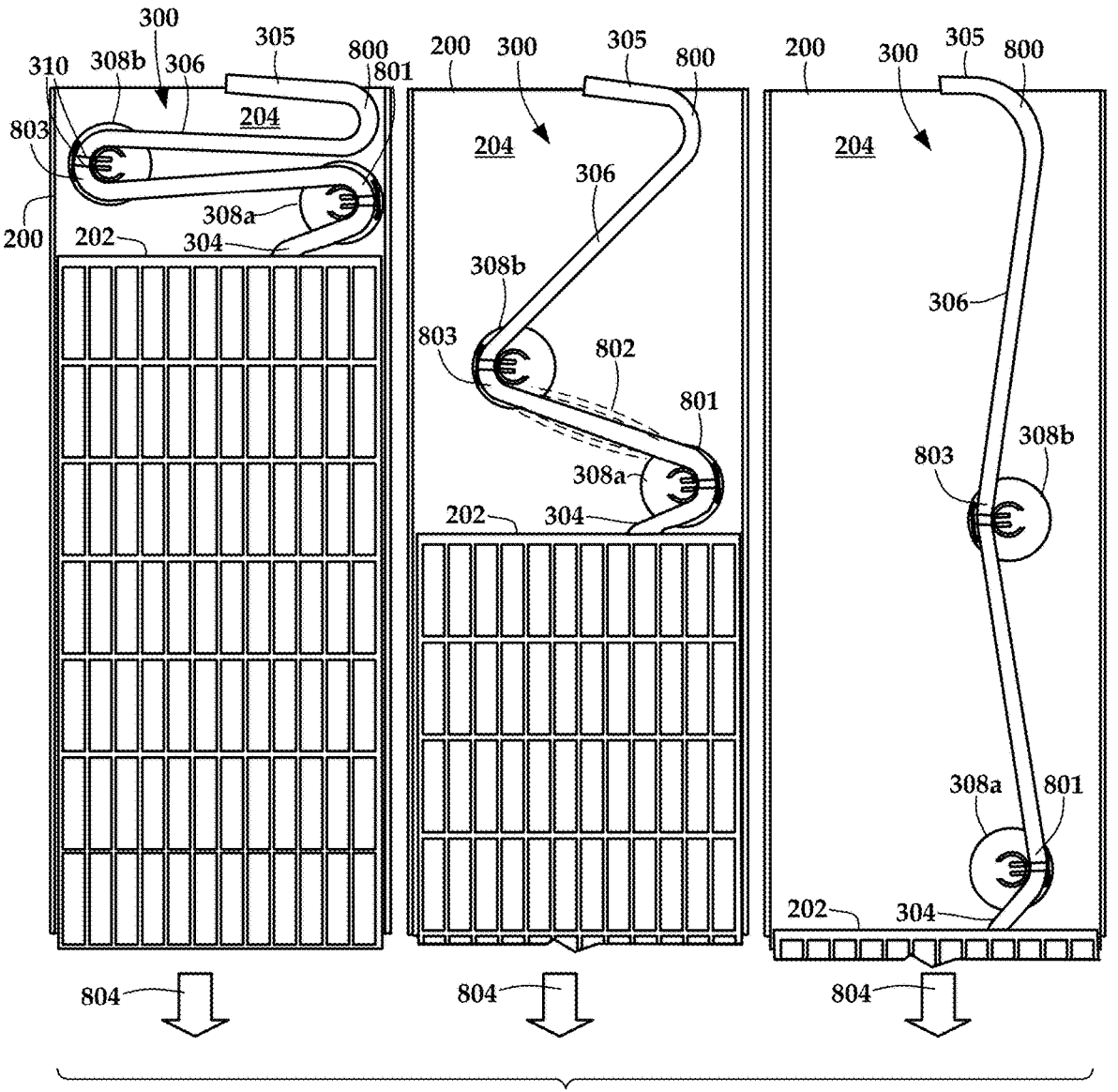
FIG. 8 is a top view showing a cable harness extending and retracting according to an example embodiment.

In FIG. 8, a top view shows how the cable harness 300 folds and unfolds when the sliding part 202 of the enclosure is moved from the closed state (left hand side of the figure) to the open state (right hand side of the figure). In this example, the first and second ends 304, 305 are fixed via strain reliefs or the like to maintain a predetermined angle relative to the respective fixed part 200 and the sliding part 202 of the electronics enclosure. While two pucks 308*a-b* are shown in this example, a third puck may be optionally added near region 800 of the cables 306 to enforce a bend at that region 800.

The sequence from left to right in FIG. 8 occurs when the sliding part 202 is extended out of the rack, as indicated by the arrows 804. When the sliding part 202 is slid back into the rack, the sequence is reversed, right to left. A first puck 308*a* enforces a first bend 801 proximate the sliding part 202 of the enclosure, and a second puck 308*b* enforces a second bend 803 between the first puck 308*b* and the back end of the fixed part 200. The first and second bends 801, 803 (along with bend at region 800) result in a serpentine folding of the cable harness 300 in the closed state of the electronics enclosure.

The pucks 308*a-b* are able to slide freely along the floor 204 of the fixed part 200, and so their movement resulting from sliding part movement may be dependent on factors such as the stiffness of the cables 306, the amount of total movement of the sliding part 202, the number and location of pucks used, etc. The cables 306 may be pre-strained (e.g., bent) before or during assembly with the respective pucks 308*a-b* to bias the cables 306 to primarily bend in those regions. As explained below, the cables 306 may also bend somewhat between the pucks 308*a-b* and ends 304, 305, but no so much as to impede the orderly folding and unfolding to the cable harness 300.

There may be some bending and/or separation between multiple cables 306 between the two pucks 308 *a-b*, as represented by dashed lines 802 in the middle view of the figure. A similar bending/separation may occur between respective pucks 308 *a-b* and first and second ends 304, 305 of the harness. This bending/separation can be due, among other things, by different bending stiffness of cables 306 within the harnesses and a natural tendency of some cables to flex. This type of flexure has not been found to negatively affect the folding mechanism, and may help to allow the cable harness 300 to fold more easily with less strain near the bends. The orientation of the rigid axis of the cables 306 helps prevent the cable harness 300 from deflecting vertically relative to the enclosure floor 204. As shown in FIG. 2, this vertical stability ensures the cable harness 300 folds into the provided cavity 214, and therefore does not impede cooling airflow in the closed state.

FIG. 9, a flowchart shows a method according to an example embodiment. The method involves attaching 900 a first end of a cable harness to a back end of a sliding part of an electronics enclosure that is slidably mounted to a fixed part of the electronics enclosure. The fixed part has a floor that is adjacent to a bottom of the sliding part in a closed state of the electronics enclosure. A second end of the cable harness is attached 901 to a back end of the fixed part of the electronics enclosure. At least one puck is attached 902 to at least one cable of the cable harness between the first end and the second end. The at least one cable has a bendable axis and a rigid axis orthogonal to the bendable axis. The puck allows the at least one cable to bend at the puck along the bendable axis. The puck is slidable along the floor of the fixed part when the sliding part is transitioned between the closed state and an opened state. The method may optionally involve non-slidably attaching 903 (e.g., without the use of slides or other linear bearings between the fixed part and the rack) the fixed part of the electronics enclosure to an electronics rack.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g., 1 to 5 includes 1, 1.5, 2, 2.75, 3, 3.80, 3, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination and are not meant to be limiting, but purely illustrative. It is intended that the scope of the invention be limited not with this detailed description, but rather determined by the claims appended hereto.

What is claimed is:

1. An electronics enclosure, comprising:
   a fixed part that attaches to a rack;
   a sliding part that houses computing equipment, the sliding part slidably disposed in the fixed part, the fixed part having a floor that is adjacent to a bottom of the sliding part in a closed state of the electronics enclosure; and
   a cable harness having a first end attached to a back end of the sliding part and a second end attached to a back end of the fixed part, the cable harness comprising:
      at least one cable extending from the first end to the second end of the cable harness, the at least one cable having a bendable axis and a rigid axis orthogonal to the bendable axis; and
      at least one puck that is fastened to the at least one cable and allowing the at least one cable to bend at the puck between the first and second ends along the bendable axis, the puck slidable along the floor of the fixed part when the sliding part is transitioned between the closed state and an opened state.

2. The electronics enclosure of claim 1, further comprising:
   one or more fan modules at the back end of the fixed part; and
   a cavity below the one or more fan modules, wherein the cable harness folds into the cavity in the closed state of the electronics enclosure.

3. The electronics enclosure of claim 1, wherein the at least one puck provides the only contact point or points between the cable harness and the floor between the first and second ends.

4. The electronics enclosure of claim 1, wherein the puck comprises a convex curved surface that contacts a major surface of the at least one cable to enforce a minimum bend radius in the cable harness.

5. The electronics enclosure of claim 1, wherein the puck comprises:
   a base having a bottom surface that slides along the floor; and an inner support and an outer support that extend from the base, the at least one cable being deployed between the inner support and the outer support.

6. The electronics enclosure of claim 5, wherein the inner support comprises a convex curved surface that contacts a major surface of the at least one cable to enforce a minimum bend radius in the cable harness.

7. The electronics enclosure of claim 5, wherein the outer support is disposed between the at least one cable and a wall of the fixed part, preventing contact between the cable and the wall.

8. The electronics enclosure of claim 5, wherein the inner support and the outer support comprise each comprise at least one slot which facilitates attaching a fastening strap around the puck and retain the at least one cable, the puck further comprising an elongated slot in the base that aligns with the slots of the inner support and the outer support, the elongated slot housing the fastening strap such that the fastening strap does not extend beyond the bottom surface of the base.

9. The electronics enclosure of claim 1, wherein the at least one puck comprises:
   a first puck that enforces a first bend proximate the sliding part; and
   a second puck that enforces a second bend between the first puck and the back end of the fixed part, wherein the first and second bends result in a serpentine folding of the cable harness in the closed state of the electronics enclosure.

10. The electronics enclosure of claim 9, wherein the at least one puck comprises a third puck that enforces a third bend between the back end of the fixed part and the second puck.

11. The electronics enclosure of claim 1, wherein the at least one cable is self-supporting between any two of the first end, the second end, and the at least one puck.

12. The electronics enclosure of claim 1, wherein the at least one cable comprises at least one signal ribbon cable and at least two power ribbon cables.

13. The electronics enclosure of claim 12, wherein the at least two power ribbon cables comprise flat braided wire cables.

14. The electronics enclosure of claim 1, wherein the computing equipment comprises an array of storage drives.

15. An electronics rack comprising at least one electronics enclosure according to claim 1 mounted therein.

16. The electronics rack of claim 15, wherein the fixed part of the at least one electronics enclosure is non-slidably attached to the electronics rack.

17. A method comprising:
   attaching a first end of a cable harness to a back end of a sliding part of an electronics enclosure that is slidably mounted to a fixed part of the electronics enclosure, the fixed part having a floor that is adjacent to a bottom of the sliding part in a closed state of the electronics enclosure;
   attaching a second end of the cable harness to a back end of the fixed part of the electronics enclosure; and
   fastening at least one puck to at least one cable of the cable harness between the first end and the second end, the at least one cable having a bendable axis and a rigid axis orthogonal to the bendable axis, the puck allows the at least one cable to bend at the puck along the bendable axis, the puck slidable along the floor of the fixed part when the sliding part is transitioned between the closed state and an opened state.

18. The method of claim 17, wherein the puck comprises a base having a bottom surface that slides along the floor and an inner support and an outer support that extend from the base, wherein fastening the at least one puck to the at least one cable comprises deploying the at least one cable between the inner support and the outer support.

19. The method of claim 18, wherein fastening the at least one puck to the at least one cable comprises attaching a fastening strap around the inner support and the outer support.

20. The method of claim 17, further comprising non-slidably attaching the fixed part of the electronics enclosure to an electronics rack.

* * * * *